(12) United States Patent
Yamada et al.

(10) Patent No.: US 8,329,504 B2
(45) Date of Patent: Dec. 11, 2012

(54) METHOD OF FORMING ORGANIC SEMICONDUCTOR LAYER AND METHOD OF MANUFACTURING ORGANIC THIN FILM TRANSISTOR

(75) Inventors: Jun Yamada, Ibaraki (JP); Yuya Hirao, Koka (JP)

(73) Assignee: Konica Minolta Holdings, Inc., Tokyo (JP)

( * ) Notice: Subject to any disclaimer, the term of this patent is extended or adjusted under 35 U.S.C. 154(b) by 158 days.

(21) Appl. No.: 12/866,839

(22) PCT Filed: Jan. 30, 2009

(86) PCT No.: PCT/JP2009/051562
§ 371 (c)(1),
(2), (4) Date: Aug. 9, 2010

(87) PCT Pub. No.: WO2009/101862
PCT Pub. Date: Aug. 20, 2009

(65) Prior Publication Data
US 2010/0323473 A1    Dec. 23, 2010

(30) Foreign Application Priority Data
Feb. 12, 2008    (JP) .................................. 2008-030214

(51) Int. Cl.
*H01L 51/40* (2006.01)
(52) U.S. Cl. .............................. 438/99; 438/82; 438/154
(58) Field of Classification Search .................... 438/82, 438/99, 781, 149, 154, 197, 199; 257/E21.299
See application file for complete search history.

(56) References Cited

U.S. PATENT DOCUMENTS

| 6,107,117 A | 8/2000 | Bao et al. .......................... 438/99 |
| 6,690,029 B1 | 2/2004 | Anthony et al. ................. 257/40 |
| 2005/0071969 A1 | 4/2005 | Sirringhaus |
| 2006/0281332 A1 | 12/2006 | Duinveld et al. .............. 438/780 |
| 2007/0210311 A1 | 9/2007 | Ando |
| 2007/0254429 A1 | 11/2007 | Cho et al. ....................... 438/239 |

FOREIGN PATENT DOCUMENTS

| CN | 1475036 A | 2/2004 |
| CN | 1791965 A | 6/2006 |
| DE | 602004006256 T2 | 1/2008 |
| EP | 1 670 079 A2 | 6/2006 |
| EP | 1 748 502 A1 | 1/2007 |
| JP | 10-190001 A | 7/1998 |
| JP | 2004-172479 A | 6/2004 |

(Continued)

OTHER PUBLICATIONS

Dimitrakopoulos, Christos D. and Malenfant, Patrick R. L. "Organic Thin Film Transistors for Large Area Electronics," *Advanced Materials*, 2002, vol. 14, No. 2, Jan. 16, pp. 99-117.

(Continued)

*Primary Examiner* — Thanhha Pham
(74) *Attorney, Agent, or Firm* — Cozen O'Connor

(57) ABSTRACT

Disclosed is a method of forming an organic semiconductor layer comprising the steps of preparing a substrate having a groove formed on the surface, applying, to the surface of the substrate, a droplet of an organic semiconductor liquid in which an organic semiconductor material is dissolved or dispersed in a solvent, and drying the droplet to form the organic semiconductor layer, wherein the droplet is applied to a position of the substrate where a part of the circumference of the droplet is introduced into the groove.

13 Claims, 5 Drawing Sheets

FOREIGN PATENT DOCUMENTS

| | | |
|---|---|---|
| JP | 2004-517737 A | 6/2004 |
| JP | 2005-150328 A | 6/2005 |
| JP | 2007-515776 A | 6/2007 |
| JP | 2007-243081 A | 9/2007 |
| JP | 2007-300116 A | 11/2007 |
| KR | 10-2006-0015270 A | 2/2006 |
| KR | 10-2007-0106259 A | 11/2007 |
| WO | WO 02/29912 A1 | 4/2002 |
| WO | WO 2004/055920 A2 | 7/2004 |
| WO | WO 2004/105104 A1 | 12/2004 |
| WO | WO 2004/111729 A1 | 12/2004 |
| WO | WO 2009/101862 A1 | 8/2009 |

OTHER PUBLICATIONS

Kane, M. G. et al "6.5L; Late-News Paper: AMLCDs using Organic Thin-Film Transistors on Polyester Substrates," *SID 2001 Digest*, Jun. 2001, vol. 32, pp. 57-59.

Payne, Marcia M., et al. "Organic Field-Effect Transistors from Solution-Deposited Functionalized Acenes with Mobilities as High as 1 $cm^2/V \cdot s$," *J AM Chem Soc*, 2005, vol. 127, pp. 4986-4987.

Kim, Yong-Hoon, et al. "P-12: Enhanced Pentacene OTFTs with Suspended Source/Drain Electrode," *SID 2007 Digest*, 2007, pp. 214-217.

Extended European Search Report dated May 30, 2011, for counterpart European Application No. 09709807.3.

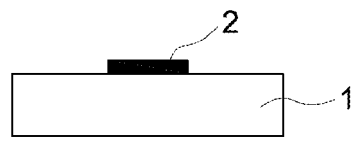
FIG. 6a
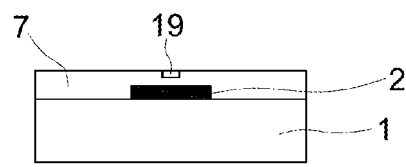
FIG. 6b
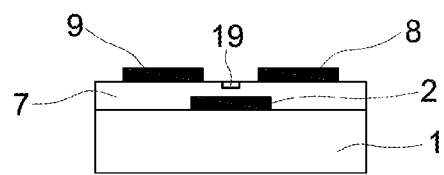
FIG. 6c
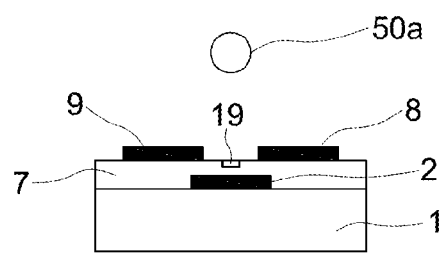
FIG. 6d
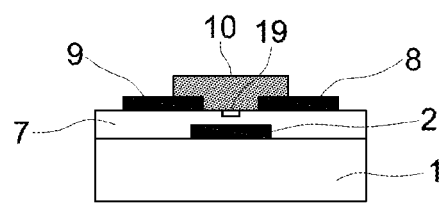
FIG. 6e
FIG. 7
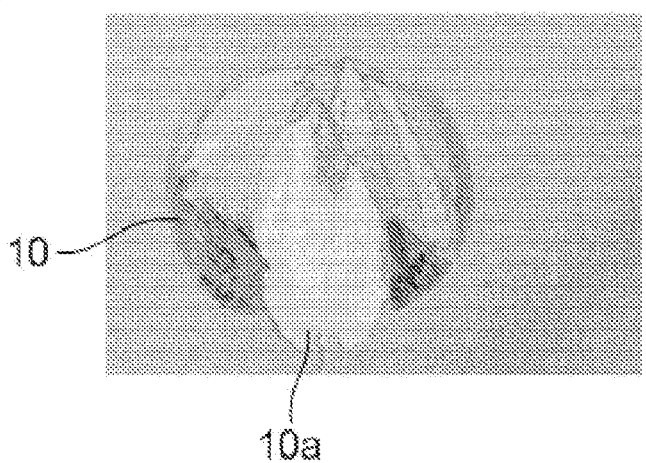

2

METHOD OF FORMING ORGANIC SEMICONDUCTOR LAYER AND METHOD OF MANUFACTURING ORGANIC THIN FILM TRANSISTOR

RELATED APPLICATIONS

This application is a U.S. National Phase Application under 35 U.S.C. 371 of International Application No. PCT/JP2009/051562, filed with Japanese Patent Office on Jan. 30, 2009, which claims priority to Japanese Patent Application No. 2008-030214, filed Feb. 12, 2008.

FIELD OF THE INVENTION

The present invention relates to a method of forming a semiconductor layer and a method of manufacturing an organic thin film transistor.

TECHNICAL BACKGROUND

In recent years, research and development of an organic thin film transistor element utilizing an organic semiconductor material has been actively carried out for a technique to make up for disadvantage of an thin film transistor (hereinafter also referred to as TFT) element utilizing a conventional silicon material (refer to Patent Document 1, Non-patent Document 1 and the like).

The organic TFT element can be manufactured by a low temperature manufacturing process, and enables use of a resin substrate which is difficult to break and light. Further, the organic TFT element is considered to enable to realize a flexible display employing a resin film as a support member (refer to Non-Patent Document 2 and the like).

Further, in recent years, many methods have been proposed in which a TFT, for use as a pixel driving element, for example, is manufactured under atmospheric pressure, employing a coating apparatus represented by an ink jet process for the purpose of high productivity and reduction of manufacturing cost. For example, there is disclosed a technique in which, in the process of forming a TFT for a liquid crystal panel or an organic EL (Electro Luminescence) panel used as display device, a droplet of a semiconductor liquid in which a semiconductor material is dissolved or dispersed in a solvent is jetted and sequentially applied onto a substrate employing a coating apparatus to form a semiconductor layer (refer to Patent Document 2).

It is necessary that the TFT for driving pixels in a display panel be formed on a substrate in the form of a matrix at the same interval as in the pixel alignment. During a process of forming a TFT, a head, in which nozzles for jetting the semiconductor liquid are aligned in a line, is moved on a substrate, so that the semiconductor liquid is sequentially jetted from the nozzles onto the substrate. The solvent of the semiconductor liquid jetted onto the substrate is gradually vaporized, in which, as the concentration of the semiconductor liquid increases, the semiconductor crystal of the semiconductor material grows. Thus, a semiconductor layer for a TFT is formed.

Patent Document 1: Japanese Patent O.P.I. Publication No. 10-190001
Patent Document 2: Japanese Patent O.P.I. Publication No. 2007-243081
Non-Patent Document 1: Advanced Material, 2002, No. 2, page. 99 (Review)
Non-Patent Document 2: SID '01 Digest page 57

DISCLOSURE OF THE INVENTION

Problems to be Solved by the Invention

However, in a conventional crystal formation method, crystallization proceeds from the outer circumference of a droplet towards the center of the droplet, and there are plural sites which initiate crystallization. The plural crystallization initiation sites are difficult to control. Crystallization is initiated at the plural crystallization initiation sites, resulting in plural crystal grain boundaries. Accordingly, a semiconductor layer formed is not in the state approximate to a single crystal, but it is in the amorphous state or contains microcrystal aggregates in many portions thereof.

In the amorphous state, molecules are not regularly aligned, and the amorphous state lowers carrier mobility as compared with the crystalline state. Small crystals produce many particle interfaces between the crystals, and increase carrier trapping sites. A transistor made of such crystals has problem in that hysteresis is increased.

The present invention has been made in view of the aforementioned. An object of the invention is to provide a method of forming an organic semiconductor layer in which a large crystal semiconductor layer is formed on a substrate, and to provide a method of manufacturing an organic thin film transistor in which an organic thin film transistor with excellent properties is manufactured.

Means for Solving the Above Problems

1. A method of forming an organic semiconductor layer comprising the steps of:
preparing a substrate having a groove formed on the surface;
applying, to the substrate, a droplet of an organic semiconductor liquid in which an organic semiconductor material is dissolved or dispersed in a solvent; and
drying the droplet to form the organic semiconductor layer,
wherein the droplet is applied to a position of the substrate where a part of the circumference of the droplet is introduced into the groove.

2. A method of forming an organic semiconductor layer of claim 1, wherein a configuration of the groove is 5 nm to 50 nm in depth in the thickness direction of the substrate and 450 nm to 1200 nm in width on the substrate surface to which the droplet is applied.

3. A method of manufacturing an organic thin film transistor comprising a gate electrode, a gate insulation layer, a source electrode, a drain electrode and an organic semiconductor layer, wherein the organic semiconductor layer is formed according to the method of claim 1 or 2.

EFFECT OF THE INVENTION

According to the present invention, a large crystal organic semiconductor layer can be formed by applying a droplet of an organic semiconductor liquid to a position where a part of the outer circumference of the droplet is introduced into the groove. Further, the present invention can provide a method of manufacturing an organic thin film transistor having on a substrate a thin film transistor with excellent properties.

BRIEF EXPLANATION OF THE DRAWINGS

FIGS. 6a, 6b, 6c, 6d, and 6e are illustrations explaining a method of manufacturing an organic TFT of a bottom gate bottom contact type by using the method of forming an organic semiconductor layer. in the embodiment.

FIG. 7 is one example of a micrograph of a semiconductor layer 10 formed in Example 1.

EXPLANATION OF NUMERICAL NUMBERS

| | |
|---|---|
| 1 | Substrate |
| 2 | Gate electrode |
| 7 | Gate insulation layer |
| 8 | Drain electrode |
| 9 | Source electrode |
| 10 | Semiconductor layer |
| 19 | Groove |
| 20 | Substrate support member |
| 50a, 50b, and 50c | Droplet |
| 80 | Head |
| 81 | Nozzle |
| 90 | Coating apparatus |
| 93 | Control section |
| 95 | Nozzle driving section |
| 97 | Head driving section |

PREFERRED EMBODIMENT FOR CARRYING OUT THE INVENTION

Next, the present invention will be explained in detail employing the embodiment of the invention, but the present invention is not limited thereto.

Figure 1:
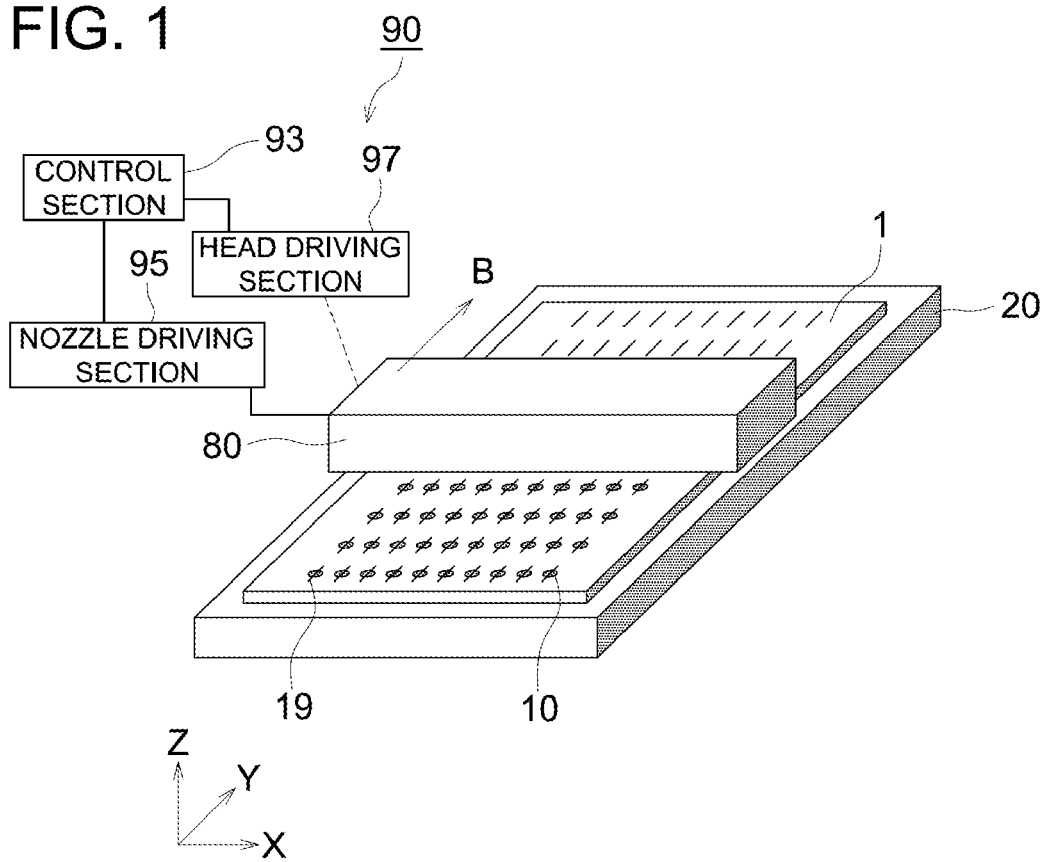
FIG. 1 is a perspective view schematically showing the structure of main sections of a coating apparatus 90 in the embodiment of the present invention.
Figure 2:
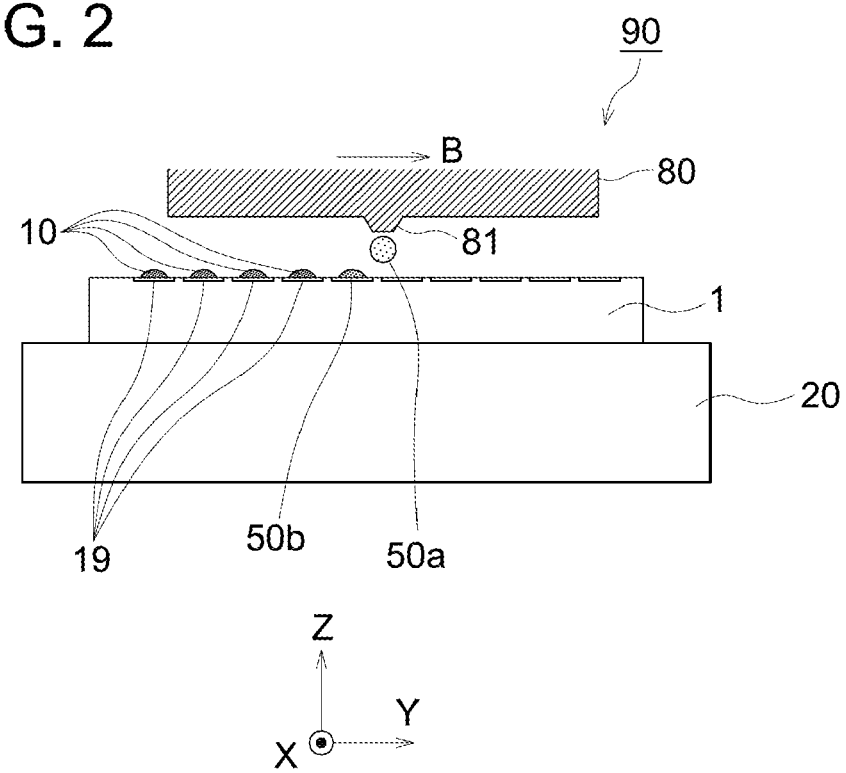
FIG. 2 is a sectional view schematically showing the structure of main sections of a coating apparatus 90 in the embodiment of the present invention.

FIG. 1 is a perspective view schematically showing the structure of main sections of a coating apparatus 90 in the embodiment of the present invention. FIG. 2 is a sectional view schematically showing the structure of main sections of a coating apparatus 90 in the embodiment of the present invention. The coating apparatus 90 in the embodiment of the present invention will be explained employing FIGS. 1 and 2.

The coating apparatus 90 is an apparatus which applies an organic semiconductor liquid onto a predetermined position of a substrate 1 to form an organic semiconductor layer 10 in the form of a matrix. As shown in FIG. 1, the coating apparatus 90 is composed of a substrate support member 20 on which a substrate 1 is provided, a head 80, a head driving section 97, a nozzle driving section 95, a control section 93 and the like. As is shown in FIG. 1 and FIG. 2, a groove 19 is provided on the surface of the substrate 1 on the side onto which a semiconductor liquid is applied. The groove 19 will be explained in detail later.

X, Y and Z co-ordinate axes showing a three dimensional co-ordinate system are illustrated on the lower left in FIG. 1. FIG. 2 is a sectional view in a direction of the Y axis of the co-ordinate system shown in FIG. 1. Explanation of a drawing will be made below, employing this co-ordinate system.

The nozzle 81 as shown in FIG. 2 is connected to a storage tank (not illustrated) storing a semiconductor liquid and the semiconductor liquid is supplied to the nozzle 81 from the tank. A plurality of nozzles 81 are disposed at a pre-determined interval in the X axis direction on the surface of the head 80, facing the substrate 1. Each of the nozzles 81 is provided with a piezoelectric element and the like, which is used in a nozzle of a known ink jet method, and is constructed so that the control section 93 can control a jetting amount of the semiconductor liquid through the nozzle driving section 95. The head driving section 97 sequentially moves head 80 in a direction as shown in an arrow B (in the positive direction of Y axis). The nozzle driving section 95 drives a piezoelectric element installed in each nozzle 81 and jets a droplet 50a of a semiconductor liquid in a predetermined amount onto a position where a part of the outer circumference of the droplet 50a is introduced into the groove 19. Thus, the droplet of the semiconductor liquid is applied onto the substrate.

As is shown in FIG. 2, the semiconductor liquid forms a droplet 50b in the form of liquid immediately after it is applied onto the substrate 1. Then the solvent of the semiconductor liquid is evaporated, whereby a semiconductor crystal grows to form a semiconductor layer 10.

Next, a shape of the groove 19 and a position onto which a semiconductor liquid is jetted will be explained, employing FIGS. 3, 4 and 5.

FIG. 3 is a perspective view of a section of the groove 19. FIG. 4 is an illustration explaining the state in which a part of the outer circumference of a droplet of an organic semiconductor liquid is introduced into the groove 19. FIG. 5 is an illustration explaining the relationship between a groove 19 and a position onto which a semiconductor liquid is jetted.

Figure 3A:
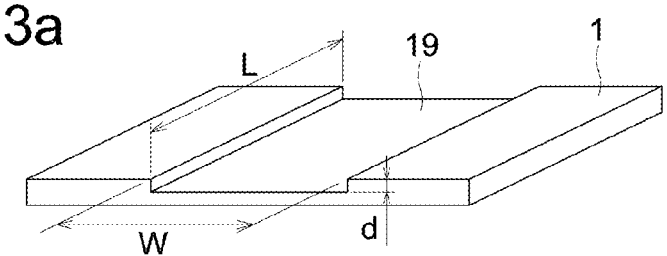
FIGS. 3a and 3b are perspective views of a section of a groove 19 in the embodiment of the present invention.
Figure 3B:
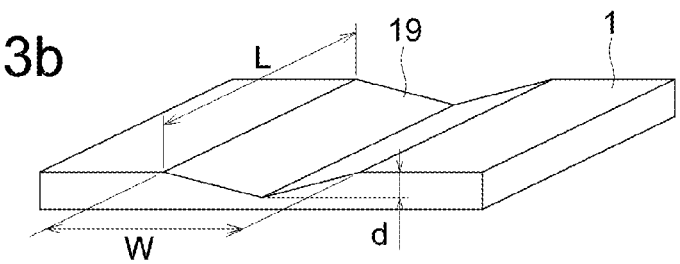

FIG. 3(a) shows an example in which the section of the groove 19 is rectangular, and FIG. 3(b) an example in which the section of the groove 19 is V-shaped. In the invention, the shape of the section of the groove 19 is not specifically limited and the section may be any shape other than the rectangular shape or V-shape.

The symbol d shows the depth of the groove 19 in the thickness direction (in the Z axis direction) of the substrate 1, the symbol w the width of the groove 19, and the symbol L the length of the groove 19.

Figure 4A:
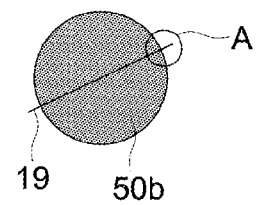
FIGS. 4a, 4b, and 4c are illustrations explaining the state in which a part of the outer circumference of a droplet of an organic semiconductor liquid is introduced into a groove 19.
Figure 4B:
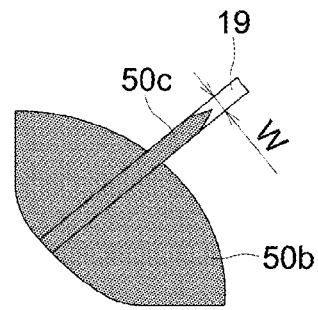

FIG. 4(a) is an illustration viewing from the positive direction of the Z axis one of the droplet 50b formed immediately after the semiconductor liquid is applied onto the substrate 1 as explained in FIG. 2 above. FIG. 4(b) is an illustration in which a portion as shown in symbol A in FIG. 4(a) is enlarged, and FIG. 4(c) is a sectional view of a portion as shown in symbol A in FIG. 4(a) in the groove 19.

Figure 4C:
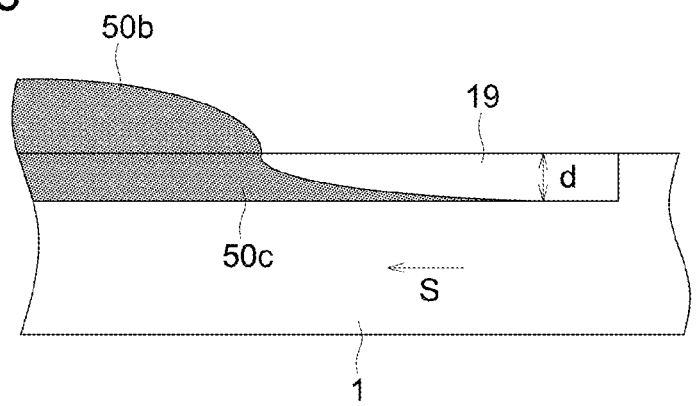

When, as shown in FIG. 4(a), the droplet 50b of the semiconductor liquid is dropped on the groove 19, a part of the outer circumference of the droplet 50(b) is introduced into the groove 19, as shown in FIG. 4(b) or FIG. 4(c). In the figures, "50c" shows a semiconductor liquid having been introduced into the groove 19. The semiconductor liquid 50c, which have been introduced into the groove 19, further flows and spreads along the groove 19.

The tip of the semiconductor liquid 50c is thin, as compared to the depth d of the groove 19, as shown in FIG. 4(c), and therefore, the solvent of the liquid is likely to vaporize in the tip of the liquid. Therefore, crystallization initiates at the tip of the liquid to produce a crystal. The crystal produced due to the crystallization initiated at the portion A grows in the direction (in the direction as shown in an arrow S) of the droplet 50b of the semiconductor liquid in which the solvent is not still volatilized, resulting in a large crystal.

Thus, the groove 19 functions as an initiation site for crystallization in the semiconductor solution and can stably provide a large crystal.

Figure 5A:
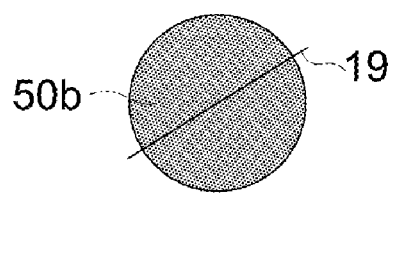
FIGS. 5a, 5b, 5c, 5d, 5e, and 5f are illustrations explaining the relationship between a groove 19 and a position onto which a semiconductor liquid is jetted.
Figure 5B:
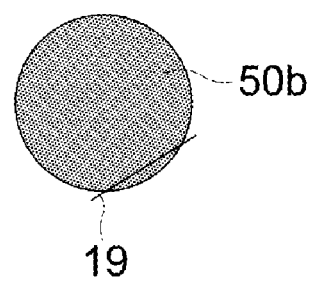
Figure 5C:
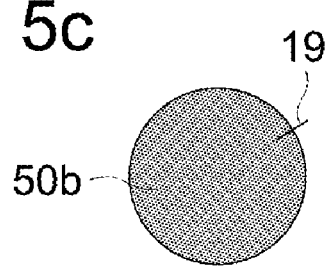
Figure 5D:
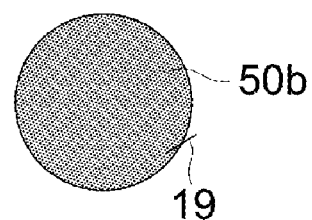

Next, the relation between the groove 19 and a position onto which the semiconductor liquid is jetted will be explained. FIG. 5(a) and FIG. 5(b) are examples in which the groove 19 passes through the region covered by the droplet 50b of the semiconductor liquid, FIG. 5(c) and FIG. 5(d) are examples in which the groove 19 partly intersects the region covered by the droplet 50b of the semiconductor liquid, and FIG. 5(e) and FIG. 5(f) are examples in which the groove 19 does not intersect the region occupied by the droplet 50b of the semiconductor liquid.

The examples of FIGS. 5(a), 5(b), 5(c) and 5(d) are different from each other in the length L of the groove 19 and in the relative position of the groove 19 to the droplet 50b. In any one of these examples, the groove 19 functions as an initiating site for crystallization in the semiconductor liquid and can stably produce a large crystal. In these examples, the length of a part of the groove 19 which is not covered by the droplet 50b is preferably at least 10% of the diameter of the region covered by the droplet 50b, in order to form the tip of the semiconductor liquid 50c which is thin as compared with the depth d of the groove 19 into which the tip is introduced.

Figure 5E:
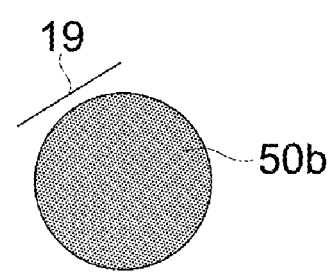
Figure 5F:
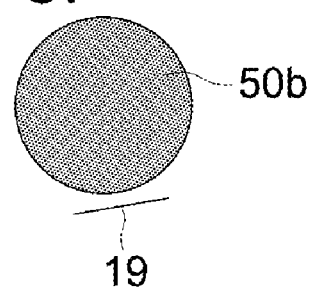

The groove 19, which does not intersect the region occupied by the droplet 50b of the semiconductor liquid, as shown in FIG. 5(e) and FIG. 5(f), cannot provide the advantageous effect as described above. Therefore, when the semiconductor liquid is jetted, it is necessary to jet the semiconductor liquid onto a position where at least a part of the semiconductor solution is introduced into the groove 19 as shown in FIG. 4(c).

With respect to the depth d and width w of the groove 19, the depth d is in the range of preferably from 5 nm to 50 nm, and the width w is in the range of preferably from 450 nm to 1200 nm, which will be explained later.

FIG. 6 is an illustration explaining a method of manufacturing an organic TFT of a bottom gate bottom contact type by use of the method of forming an organic semiconductor layer in the embodiment of the invention.

In the method of manufacturing an organic TFT of a bottom gate bottom contact type, the following steps S1 through S5 will be explained below.

S1: Step of forming a gate electrode and a gate insulation layer
S2: Step of forming a groove
S3: Step of forming a source electrode and a drain electrode
S4: Step of jetting a semiconductor liquid
S5: Step of drying the semiconductor liquid to form a semiconductor layer The method of manufacturing a TFT of a bottom gate bottom contact type will be sequentially explained, employing FIG. 6.

FIGS. 6(a) through 6(e) are sectional views of a channel portion of a TFT element.

S1: Step of Forming a Gate Electrode and a Gate Insulation Layer

As is shown in FIGS. 6(a) and 6(b), a gate electrode 2 is formed on the substrate 1, and then a gate insulation layer 7 is formed on the gate electrode 2.

In the embodiment of the invention, a material for the substrate 1 is not specifically limited. Examples of the substrate material include glass, polyimide, polyethylene terephthalate (PET), polyethylene naphthalate (PEN), and polyether sulfone (PES).

As a method for forming a gate electrode 2, there can be used a method in which a film composed of an electrode material is formed on the substrate 1 by a sputtering method or a vacuum deposition method and subjected to patterning according to photolithography, or a method in which an electrode material film is formed only at an intended portion of the substrate according to a droplet coating method or various printing methods.

When the film film is formed by a sputtering method or a vacuum deposition method, Au, Ag, Pb, Al, Cr, Pt, Cu, ITO, and the like can be used as the electrode material. In the droplet coating method, there can be used a metal nanoparticle ink in which metal nanoparticles such as Ag nanoparticles, Au nanoparticles, and AgPb nanoparticles are dispersed in a solvent; a metal oxide nanoparticle ink in which metal oxide nanoparticles such as ITO nanoparticles are dispersed in a solvent; an organic material dispersion ink in which an organic material such as PEDOT/PSS is dispersed in a solvent; and the like.

Next, a gate insulation layer 7 is formed. As a method of forming a gate insulation layer there are a spin coat method, a CVD method, a sputtering method and the like. As a material for the gate insulation layer 7 there can be used inorganic oxide such as silicon oxide, aluminum oxide, tantalum oxide, titanium oxide and the like; inorganic nitrides such as silicon nitride, aluminum nitride and the like; and organic compounds such as polyimide, polyamide, polyester, polyacrylate, a photo-radically polymerizable photocurable resin, a photo-cationically polymerizable photocurable resin, a copolymer containing a acrylonitrile component, polyvinyl phenol, polyvinyl alcohol, novolak resin, cyanoethylpullulan and the like.

S2: Step of Forming a Groove

As shown in FIG. 6(b), a groove 19 is formed on the gate insulation layer 7.

As a constitution of the groove 19, a groove may be physically formed on the surface of the gate insulation layer 7. As a method of physically forming a groove, there can be used an EB imaging method, an embossing method, a scraper method and the like. In two layers composed of a lower liquid affinity layer and an upper liquid repellency layer, a part of the lower liquid affinity layer may be exposed in the form of a groove so as to form a groove. Further, the groove may be formed by a liquid affinity pattern in the form of a groove, whose pattern is made after a liquid repellency/liquid affinity pattern is provided by surface processing of the liquid repellency monolayer on the liquid affinity layer such as patterning the monolayer through light irradiation. FIG. 6(c) shows a groove 19 which is formed to be in parallel with the longitudinal direction of a channel between a source electrode 9 and a drain electrode 8. The groove 19, which is formed to be in parallel with the longitudinal direction of a channel and longer than the length in the longitudinal direction of the channel, completely passes through the region occupied by the semiconductor liquid droplet 50b and can function as a crystallization initiation site.

S3: Step of Forming a Source Electrode and a Drain Electrode

A source electrode 9 and a drain electrode 8 are formed on the substrate 1, as is shown in FIG. 6(c).

After the substrate 1 on which the gate insulation layer 7 has been formed is washed, a source electrode 9 and a drain electrode 8 are formed on the substrate 1, employing photolithography, a droplet coating method or various printing methods in the same manner as used for forming the gate electrode 2. As electrode materials for the source electrode 9 and the drain electrode 8, there can be used the same electrode materials as those for the gate electrode 2.

S4: Step of Jetting a Semiconductor Liquid

As shown in FIG. 6(d), the droplet 50a of the semiconductor liquid, in which the semiconductor material is dissolved or dispersed in a solvent, is ejected from the nozzle 81, employing a coating apparatus 90. The droplet 50a of the semiconductor liquid is jetted onto a portion where a part of the outer circumference of the droplet 50a is introduced into the groove 19.

The semiconductor material is not limited, as long as it is dissolved or dispersed in a solvent. Therefore, the semiconductor material may be an organic low molecular material as well as an organic high molecular material to which a solubilizing side chain is attached for increasing solubility. Further, the semiconductor material may be a low molecular material, a high molecular material or an oligomer. Furthermore, the semiconductor material may be an organic-inorganic hybrid material or an inorganic material as long as it is simultaneously coated together with a solvent, followed by drying of the solvent to form a semiconductor layer. A semiconductor precursor liquid can be also used as the semiconductor material.

The solvent is not specifically limited and examples thereof include aromatic hydrocarbons, aliphatic hydrocarbons, alcohols, ketones, ethers, esters, halogenated hydrocarbons, and phenols. The solvent suitable for the semiconductor material can be selected from the above.

S5: Step of Drying the Semiconductor Liquid to Form a Semiconductor Layer

A semiconductor liquid, which has been introduced between the source electrode 9 and the drain electrode 8, is dried to form a semiconductor layer 10 as shown in FIG. 6(e). The jetted droplet of the semiconductor liquid is introduced into the groove 19, as shown in FIG. 4(c), and the tip of the semiconductor liquid, which has been introduced into the groove 19, functions as a crystallization initiation site. Therefore, the semiconductor crystal grows large, resulting in a TFT element with high performance.

In the embodiment of the invention, explanation has been made above of the method of manufacturing a bottom gate bottom contact type organic TFT.

In the embodiment of the invention, an example of manufacturing a bottom gate bottom contact type organic TFT has been explained in the above. However, the method of forming an organic semiconductor layer in the embodiment of the invention also applies to a bottom gate top contact type organic TFT or a top gate type organic TFT.

EXAMPLES

Next, examples carried out in order to demonstrate the effect of the invention will be explained, however, the invention is not limited thereto.

Example 1

One hundred and ninety-six glass substrates of a size of 50 mm×60 mm on the surface of which a chromium film with a thickness of 125 nm was formed were prepared. On each chromium film was formed a 500 nm thick acryl film (PC 403).

A groove 19 was formed on the acryl film of each of the one hundred and ninety-six substrates 1 so that the total 196 grooves were different in a depth d and/or a width w. The shape of the groove 19 was rectangular as shown in FIG. 3(a). The depth d of the groove 19 was varied from 3 ran to 60 nm, and the width w of the groove 19 from 400 nm to 1500 nm. The length L of the groove 19 was 100 μm. The groove 19 was formed at 100 positions in the head scanning direction and at 80 positions in the head moving direction to be in accordance with the positions onto which the semiconductor liquid was jetted as shown in FIG. 1 and to meet the pitch at which the nozzles 81 were disposed and the head moving interval as described later.

As the semiconductor liquid, there was employed a solution in which a low molecular organic semiconductor material, 6,13-bistriisopropylsilylethynylpentacene was dissolved in an amount of 5% by weight in tetralin with a boiling point of 207.4° C.

The coating apparatus 90 as shown in FIG. 1 was employed for coating of the semiconductor liquid. As the head 80, a head produced by Konica Minolta IJ Technologies, Inc. was employed in which 512 nozzles 81 were disposed at a pitch of 70.5 μm.

The head 80 was moved at a pitch of 352.5 μm in the direction as shown in an arrow B in FIG. 1. In one time head scanning, the semiconductor liquid was jetted on 100 positions of the substrate in the head scanning direction and on 80 positions of the substrate in the head moving direction. On jetting, the temperature of the semiconductor liquid was 45° C., and the temperature of the substrate was 40° C. The semiconductor liquid jetted onto the substrate 1 was dried at room temperature for 15 minutes to form a semiconductor layer, and then crystallization state of the semiconductor layer 10 was observed employing a polarizing microscope.

Comparative Example 1

A chromium film with a thickness of 125 nm was formed on the surface of a glass substrate of a size of 50 mm×60 mm. On the chromium film was formed a 500 nm thick acryl film (PC 403).

A groove 19 was not formed on the surface of the acryl film of the substrate 1 as prepared above.

The semiconductor liquid was jetted onto the substrate 1 in the same manner as in Example 1 above. The semiconductor liquid jetted was dried at room temperature for 15 minutes to form a semiconductor layer, and then crystallization state of the semiconductor layer 10 formed above was observed employing a polarizing microscope.

[Experimental Results]

In this experiment, each of 8000 semiconductor layers 10 formed on the substrate 1 was observed for crystallization state employing a polarizing microscope. The crystallization state of the semiconductor layer was evaluated according to the following four criteria, A, B, C and D:

A: Crystallinity is excellent over a broad portion of the semiconductor layer.
B: Crystallinity is excellent at a greater portion of the semiconductor layer, but uncrystallized portions are observed.
C: Variation of the crystal size is observed at different portions of the semiconductor layer but large crystals are observed in some portion of the semiconductor layer.
D: No large crystals are observed in the semiconductor layer.

The results are shown in Table 1.

TABLE 1

| | | Width w (nm) | | | | | | |
|---|---|---|---|---|---|---|---|---|
| | | 400 | 450 | 500 | 550 | 600 | 700 | 800 |
| Depth d (nm) | 3 | C | C | B | C | B | C | C |
| | 4 | C | C | B | B | C | B | B |
| | 5 | B | A | A | A | A | A | A |

TABLE 1-continued

| | | | | | | | | |
|---|---|---|---|---|---|---|---|---|
| | 10 | B | A | A | A | A | A | A |
| | 15 | B | A | A | A | A | A | A |
| | 20 | B | A | A | A | A | A | A |
| | 25 | B | A | A | A | A | A | A |
| | 30 | B | A | A | A | A | A | A |
| | 35 | C | A | A | A | A | A | A |
| | 40 | B | A | A | A | A | A | A |
| | 45 | B | A | A | A | A | A | A |
| | 50 | B | A | A | A | A | A | A |
| | 55 | C | B | B | B | B | B | B |
| | 60 | C | C | B | C | B | C | C |

| | | Width w (nm) | | | | | | |
|---|---|---|---|---|---|---|---|---|
| | | 900 | 1000 | 1100 | 1200 | 1300 | 1400 | 1500 |
| Depth d (nm) | 3 | B | C | C | C | C | C | C |
| | 4 | C | B | B | B | C | C | C |
| | 5 | A | A | A | A | C | C | C |
| | 10 | A | A | A | A | B | C | C |
| | 15 | A | A | A | A | B | C | C |
| | 20 | A | A | A | A | B | C | C |
| | 25 | A | A | A | A | C | C | C |
| | 30 | A | A | A | A | B | C | C |
| | 35 | A | A | A | A | B | C | C |
| | 40 | A | A | A | A | B | C | C |
| | 45 | A | A | A | A | B | C | C |
| | 50 | A | A | A | A | B | C | C |
| | 55 | B | B | B | B | C | C | C |
| | 60 | C | C | C | C | C | C | C |

As is apparent from Table 1, the grooves having a depth d of from 5 nm to 50 nm and a width w of from 450 nm to 1200 nm formed in Example 1 are evaluated as criterion A, and it has proved that such grooves provide high crystallinity and produce a large crystal. FIG. 7 is one example of a micrograph of the semiconductor layer 10 formed in Example 1. FIG. 7 shows that a part 10a is a part of the groove 19 into which the semiconductor liquid is introduced, and that a large crystal grows from the groove 19 as a crystallization initiation site.

The grooves formed in Example 1 other than those described above are evaluated as criterion B or C, which cause variation in the crystal size but produce a large crystal. The above results show that the groove is preferably one having a depth d of from 5 nm to 50 nm and a width w of from 450 nm to 1200 nm in order to obtain stably a large crystal with high crystallinity.

Figure 8:
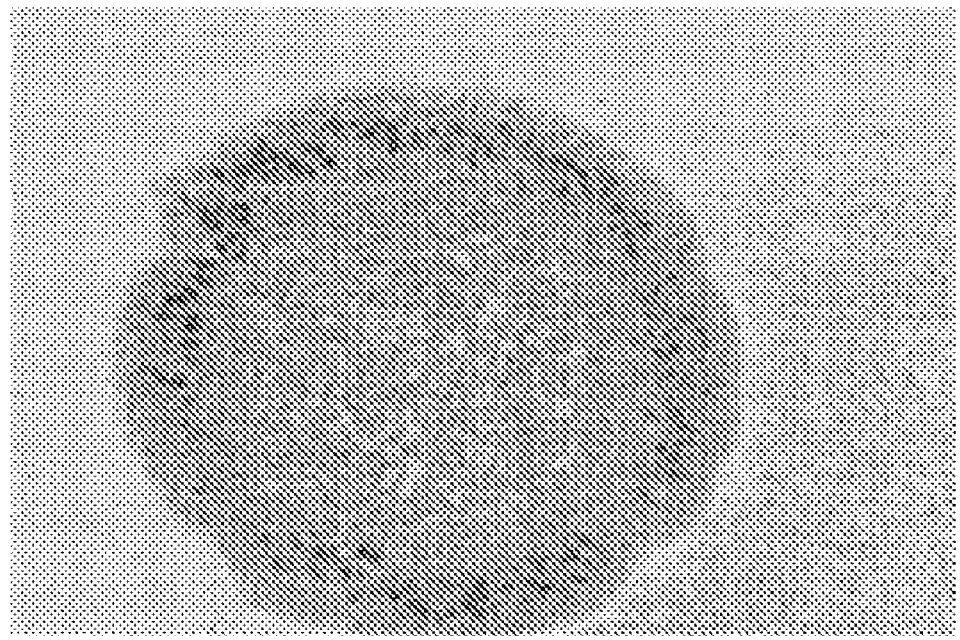
FIG. 8 is one example of a micrograph of a semiconductor layer 10 formed in Comparative Example 1 which is evaluated as criterion D.

The substrate 1 on which a groove is not formed in Comparative example 1 is evaluated as criterion D, and does not produce a large crystal. FIG. 8 is one example of a micrograph of the semiconductor layer 10, which is formed in Comparative example 1 and evaluated as criterion D. A large crystal is not found in the semiconductor layer 10 of FIG. 8.

In Example 2 and Comparative example 2 which will be explained in the following, a 90 mm×120 mm glass substrate on the surface of which a chromium film having a thickness of 125 nm was employed as a substrate 1. In Example 2, 428× 570, total 243960 bottom gate bottom contact type TFTs were formed on the substrate 1.

Example 2

In this example, a bottom gate bottom contact type TFT was prepared according to the steps of S1 to S5 as explained in FIG. 6, employing a coating apparatus 90 as explained in FIG. 1. The cross section of the groove 19 formed in this example was rectangle-shaped as shown in FIG. 3(a), and the groove had a depth d of 30 nm, a width w of 800 nm, and a length L of 100 μm. The width of the channel was 80 μm, and the length of the channel was 10 μm. Five hundred and twelve nozzles 81 were disposed in the head 80. The head 80 was moved at a pitch of 140 μm in the direction as shown in an arrow B through the head driving section 97.

The following steps will be sequentially explained employing the same step numbers as shown in FIG. 6, and explanation on those in common will be omitted.

S1: Step of Forming a Gate Electrode and a Gate Insulation Layer

A light sensitive resist was applied onto the substrate 1 on which a conductive layer had been formed, exposed to light through a photomask with a pattern of a gate electrode 2, and developed to form a resist layer in the form of the gate electrode 2. Subsequently, the resist layer was subjected to etching treatment and removed to form the gate electrode 2.

Subsequently, a $SiO_2$ film was formed employing a sputtering method or a CVD method to form an insulation layer. After that, a light sensitive acrylate material was coated on the insulation layer employing a spin coat method to have a light sensitive acrylate material film with a thickness of 100 nm and subjected to patterning according to photolithography to form a gate insulation layer 7 which was composed of the two films, the $SiO_2$ film and the light sensitive acrylate material film.

S2: Step of Forming a Groove

Employing an EB imaging method, the groove 19 having a depth d of 30 nm, a width w of 800 nm and a length L of 100 μm was provided in a channel region to be in parallel with the longitudinal direction of the channel, as shown in FIG. 6(b).

S3: Step of Forming a Source Electrode and a Drain Electrode

A source electrode 9 with a thickness of 50 μm and a drain electrode 8 with a thickness of 50 μm, each composed of Au, were formed according to photolithography.

S4: Step of Jetting a Semiconductor Liquid

The droplet 50a of a semiconductor liquid was jetted from the nozzle 81, as the head 80 was moved at a pitch of 140 μm in the direction as shown in the arrow 13. As the semiconductor liquid, a solution in which 6,13-bis(triethylsilylethynyl) pentacene was dissolved in an amount of 5% by weight in tetrahydronaphthalene was used.

S5: Step of Drying the Semiconductor Liquid to Form a Semiconductor Layer

The semiconductor liquid, which had been introduced between the source electrode 9 and the drain electrode 8, was dried to form a semiconductor layer 10, as shown in FIG. 6(e).

Comparative Example 2

This comparative example was carried out to confirm the effects of the groove 19 formed in the step S2 in Example 2. In this Comparative Example 2, a bottom gate bottom contact type TFT was prepared in the same manner as in Example 2, except that the step S2 of forming a groove was not carried out

[Experimental Results]

In this experiment, one thousand TFT elements were selected randomly from 243960 TFT elements formed on the substrate 1, and evaluated.

Electric current was applied to each of the TFT elements, and mobility was measured. The average mobility and the On/Off electric current ratio of the TFT elements prepared in Example 2 gave 0.3 $cm^2/Vs$ and a seven-digit value, respectively. While the average mobility and the On/Off electric current ratio of the TFT elements prepared in Comparative Example 2 gave 0.08 $cm^2/Vs$ and a six-digit value, respectively. It has proved that the TFT element, which was prepared employing the groove 19 in Example 2, is a TFT element with excellent properties, providing a high mobility and a high On/Off electric current ratio, as compared with the TFT element which was prepared without employing a groove in Comparative Example 2.

In this embodiment, a manufacturing method of a bottom gate bottom contact type organic TFT is disclosed as an example. However, the manufacturing method of the present invention is not specifically limited to the manufacturing method of a bottom gate bottom contact type organic TFT, and also applies to a bottom gate top contact type organic TFT or a top gate type organic TFT.

The present invention can provide a method of forming an organic semiconductor layer in which a large crystal organic semiconductor layer is formed on a substrate and a method of manufacturing an organic thin film transistor in which an organic thin film transistor with excellent properties is manufactured.

The invention claimed is:

1. A method of forming an organic semiconductor layer comprising the steps of:
    preparing a substrate having a groove on one side thereof, wherein the groove is provided such that it intersects a circumference of a region to which a droplet including an organic semiconductor material is to be applied and that the droplet after having been applied outflows and extends the groove from the region and initiates crystallization at a tip of the extended droplet;
    applying the droplet to the region; and
    drying the droplet to form the organic semiconductor layer.

2. The method of claim 1, wherein the droplet is formed by an organic semiconductor liquid prepared by dissolving the organic semiconductor material in a solvent.

3. The method of claim 1, wherein the droplet is formed by an organic semiconductor liquid prepared by dispersing the organic semiconductor material in a dispersion medium.

4. The method of claim 1, wherein a configuration of the groove is 5 nm to 50 nm in depth in a direction of a thickness of the substrate and 450 nm to 1200 nm in width on the surface of the substrate to which the droplet is applied.

5. A method of forming an organic semiconductor layer comprising the steps of:
    preparing a substrate on which a gate electrode and a gate insulating layer are formed, the gate insulation layer having a groove on it, wherein the groove is provided such that it intersects a circumference of a region to which a droplet including an organic semiconductor material is to be applied and that the droplet after having been applied outflows and extends along the groove from the region and initiates crystallization at a tip of the extended droplet;
    applying the droplet to the region; and
    drying the droplet to form the organic semiconductor layer.

6. The method of claim 5, wherein the droplet is formed by an organic semiconductor liquid prepared by dissolving the organic semiconductor material in a solvent.

7. The method of claim 5, wherein the droplet is formed by an organic semiconductor liquid prepared by dispersing the organic semiconductor material in a dispersion medium.

8. The method of claim 5, wherein a configuration of the groove is 5 nm to 50 nm in depth in a direction of a thickness of the gate insulation layer and 450 nm to 1200 nm in width on the surface of the gate insulation layer to which the droplet is applied.

9. A method of manufacturing an organic thin film transistor including a substrate, a gate electrode, a source electrode, a drain electrode, and a gate insulation layer existing between the gate electrode and the source and the drain electrodes, the method comprising the steps of:
    applying a droplet including an organic semiconductor material to a region so that the droplet contacts the source electrode and the drain electrode; and
    drying the droplet to form an organic semiconductor layer,
    wherein, before the droplet is applied, a groove is provided such that it intersects a circumference of the region to which the droplet including the organic semiconductor material is to be applied and that the droplet after having been applied outflows and extends along the groove from the region and initiates crystallization at a tip of the extended droplet.

10. A method of manufacturing an organic thin film transistor comprising the steps of:
    preparing a substrate;
    forming a gate electrode on the substrate;
    forming a gate insulation layer on the gate electrode;
    forming a groove, a source electrode and a drain electrode on the gate insulation layer, wherein said groove is formed such that it intersects a circumference of a region to which a droplet including an organic semiconductor material is to be applied and that the droplet after having been applied outflows and extends along the groove from the region and initiates crystallization at a tip of the extended droplet;
    applying the droplet to the region so that the droplet contacts the source electrode and the drain electrode; and
    drying the droplet to form an organic semiconductor layer.

11. The method of claim 10, wherein the droplet is formed by an organic semiconductor liquid prepared by dissolving the organic semiconductor material in a solvent.

12. The method of claim 10, wherein the droplet is formed by an organic semiconductor liquid prepared by dispersing the organic semiconductor material in a dispersion medium.

13. The method of claim 10, wherein a configuration of the groove is 5 nm to 50 nm in depth in a direction of a thickness of the gate insulation layer and 450 nm to 1200 nm in width on the surface of the gate insulation layer to which the droplet is applied.

* * * * *